(12) United States Patent
Huang

(10) Patent No.: US 8,633,505 B2
(45) Date of Patent: Jan. 21, 2014

(54) LIGHT SOURCE HAVING LIGHT EMITTING DIODE

(71) Applicant: Hon Hai Precision Industry Co., Ltd., New Taipei (TW)

(72) Inventor: Yung-Lun Huang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/858,100

(22) Filed: Apr. 8, 2013

(65) Prior Publication Data

US 2013/0229825 A1 Sep. 5, 2013

Related U.S. Application Data

(62) Division of application No. 12/894,122, filed on Sep. 29, 2010, now Pat. No. 8,436,381.

(30) Foreign Application Priority Data

Jun. 21, 2010 (TW) .............................. 99120164 A

(51) Int. Cl.
*H01L 33/20* (2010.01)
*H01L 33/54* (2010.01)
*F21V 8/00* (2006.01)

(52) U.S. Cl.
USPC ....... 257/98; 257/E33.059; 362/608; 362/612

(58) Field of Classification Search
None
See application file for complete search history.

(56) References Cited

U.S. PATENT DOCUMENTS

| | | | | |
|---|---|---|---|---|
| 6,666,569 B2 * | 12/2003 | Obata | ........................... | 362/339 |
| 6,791,116 B2 * | 9/2004 | Takahashi et al. | ............... | 257/79 |
| 6,981,792 B2 * | 1/2006 | Nagakubo et al. | ............ | 362/600 |
| 7,214,116 B2 * | 5/2007 | Takekuma | ....................... | 445/24 |
| 7,319,244 B2 * | 1/2008 | Liu et al. | ........................ | 257/98 |
| 7,414,270 B2 * | 8/2008 | Kim et al. | ....................... | 257/81 |
| 7,470,046 B2 * | 12/2008 | Kao et al. | ...................... | 362/332 |
| 7,888,698 B2 * | 2/2011 | Wu et al. | ......................... | 257/98 |
| 8,115,217 B2 * | 2/2012 | Duong et al. | ................... | 257/88 |
| 8,436,381 B2 * | 5/2013 | Huang | ............................ | 257/98 |
| 2006/0076568 A1 * | 4/2006 | Keller et al. | .................... | 257/98 |
| 2006/0238884 A1 * | 10/2006 | Jang et al. | ...................... | 359/653 |
| 2009/0072255 A1 * | 3/2009 | Takahashi et al. | ............... | 257/98 |
| 2009/0146158 A1 * | 6/2009 | Park | ................................ | 257/98 |
| 2009/0152573 A1 * | 6/2009 | Loh et al. | ........................ | 257/89 |
| 2009/0309116 A1 * | 12/2009 | Kato et al. | ....................... | 257/98 |
| 2009/0315051 A1 * | 12/2009 | Wu et al. | ......................... | 257/98 |
| 2009/0321759 A1 * | 12/2009 | Xu | ................................. | 257/98 |
| 2010/0090233 A1 * | 4/2010 | Hussell et al. | .................. | 257/89 |
| 2010/0163898 A1 * | 7/2010 | Hung et al. | ..................... | 257/98 |
| 2010/0177532 A1 * | 7/2010 | Simon et al. | ................... | 362/555 |
| 2012/0086039 A1 * | 4/2012 | Won et al. | ....................... | 257/98 |

* cited by examiner

*Primary Examiner* — Thomas L Dickey
*Assistant Examiner* — Joseph Schoenholtz
(74) *Attorney, Agent, or Firm* — Altis Law Group, Inc.

(57) ABSTRACT

An LED includes an LED chip, a first package configured for packaging the LED chip, the first package including a flat first surface, and a second package including a second surface opposing the first surface. A micro-structure is defined in the second surface and protruding toward the first surface. A gap is maintained between the first and second surfaces. The gap is filled with a filler, and the refractive index of the filler is smaller than that of the first and second packages. Light generated by the LED chip radiates first through the first package, then the gap and the micro-structure, thereafter the second package to finally reach an outside of the LED. A light module including the LED is also provided.

10 Claims, 8 Drawing Sheets

LIGHT SOURCE HAVING LIGHT EMITTING DIODE

CROSS-REFERENCE TO RELATED APPLICATION

This application is a divisional application of a commonly-assigned application entitled "LIGHT EMITTING DIODE AND LIGHT MODULE HAVING SAME," filed on Sep. 29, 2010 with application Ser. No. 12/894,122. The disclosure of the above-identified application is incorporated herein by reference.

BACKGROUND

1. Technical Field

The present disclosure relates to light emitting diodes (LEDs), and to a light source having the LEDs.

2. Description of Related Art

The maximum radiation angle of an LED is not 180°, so a number of LEDs aligned in a line to emit light yield a number of shadows corresponding to the gaps between adjacent LEDs. These shadows ruin the uniformity of the light field produced by the number of LEDs.

Therefore, what is needed is a light source having an LED, which can overcome the above shortcomings.

BRIEF DESCRIPTION OF THE DRAWINGS

Many aspects of the present light source having an LED can be better understood with reference to the following drawings. The components in the drawings are not necessarily drawn to scale, the emphasis instead being placed upon clearly illustrating the principles of the present light source. Moreover, in the drawings, like reference numerals designate corresponding parts throughout the views.

DETAILED DESCRIPTION

Figure 1:
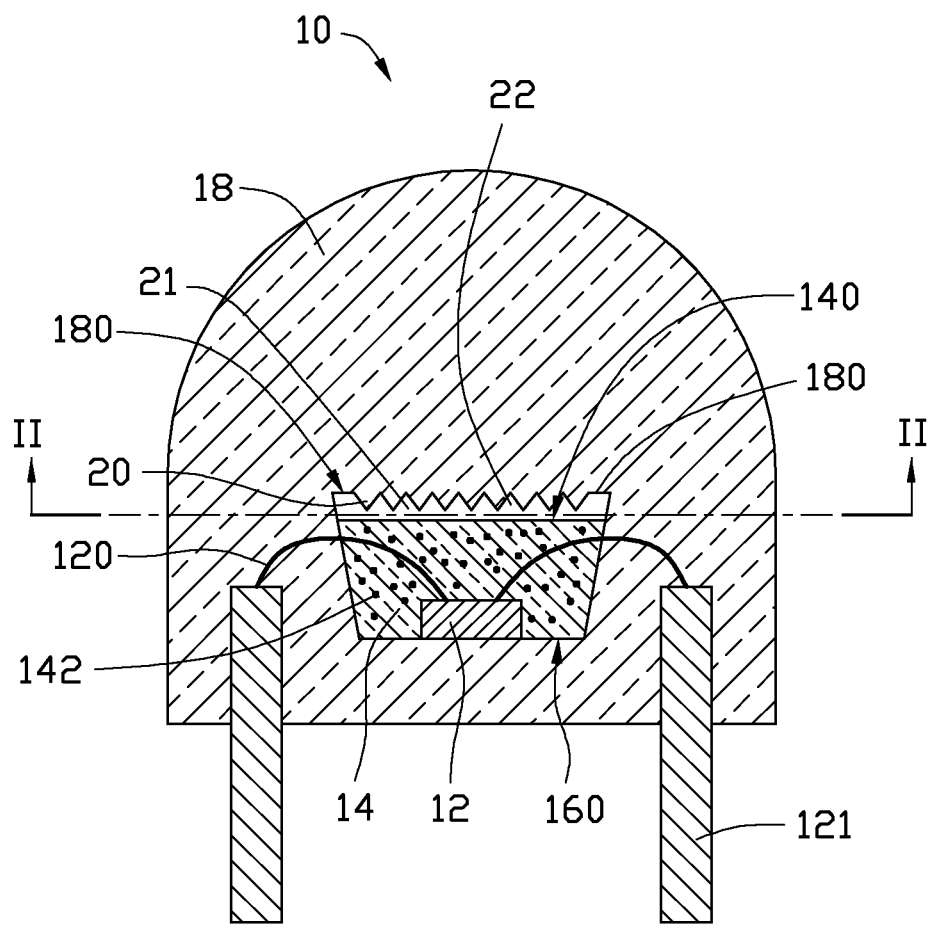
FIG. 1 is a cross-sectional view of an LED in accordance with a first exemplary embodiment.
Figure 2:
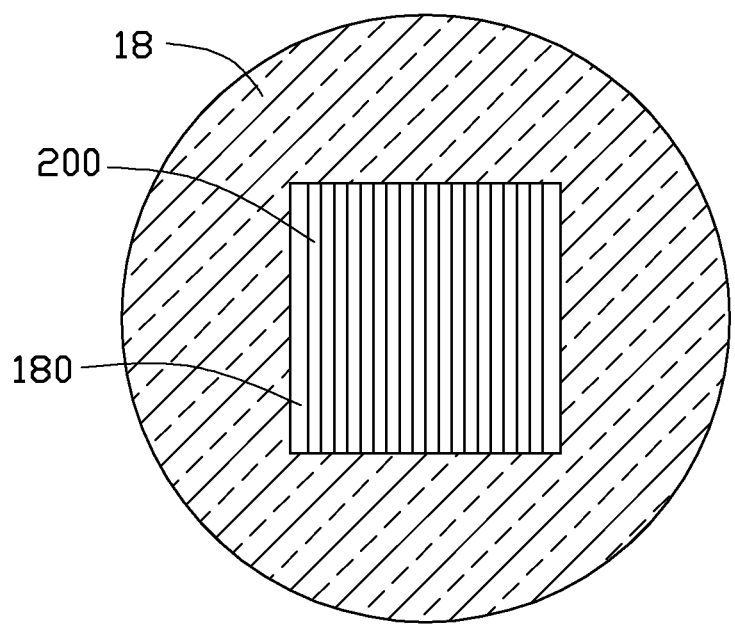
FIG. 2 is a cross-sectional view of the LED of FIG. 1, taken along line II-II, showing a micro-structure defined in a second surface of a second package of the LED.

Referring to FIGS. 1 and 2, an LED 10 in accordance with a first embodiment includes an LED chip 12, a first package 14, and a second package 18. The first package 14 is configured to encapsulate the LED chip 12. The first package 14 includes a flat first surface 140. The first surface 140 is the light emitting surface of the LED chip 12. Light beams emitted by the LED chip 12 pass through the first package 14. The second package 18 packages the first package 14. The LED chip 12 is located on a support surface 160. Conductive wires 120 coupled to the LED chip 12 are electrically connected with lead frames 121.

The second package 18 includes a substantially planar second surface 180 substantially parallel to the first surface 140. A micro-structure 20 is formed at the second surface 180 and protrudes from the second surface 180 toward the first surface 140. A gap 21 is maintained between the first and second surfaces 140 and 180. The gap 21 can be a vacuum or can be filled with filler 22. The refractive index of the filler 22 is smaller than that of the first and second packages 14 and 18. The filler 22, in this embodiment, is air. The filler 22 may instead be another gas or liquid.

Figure 3:
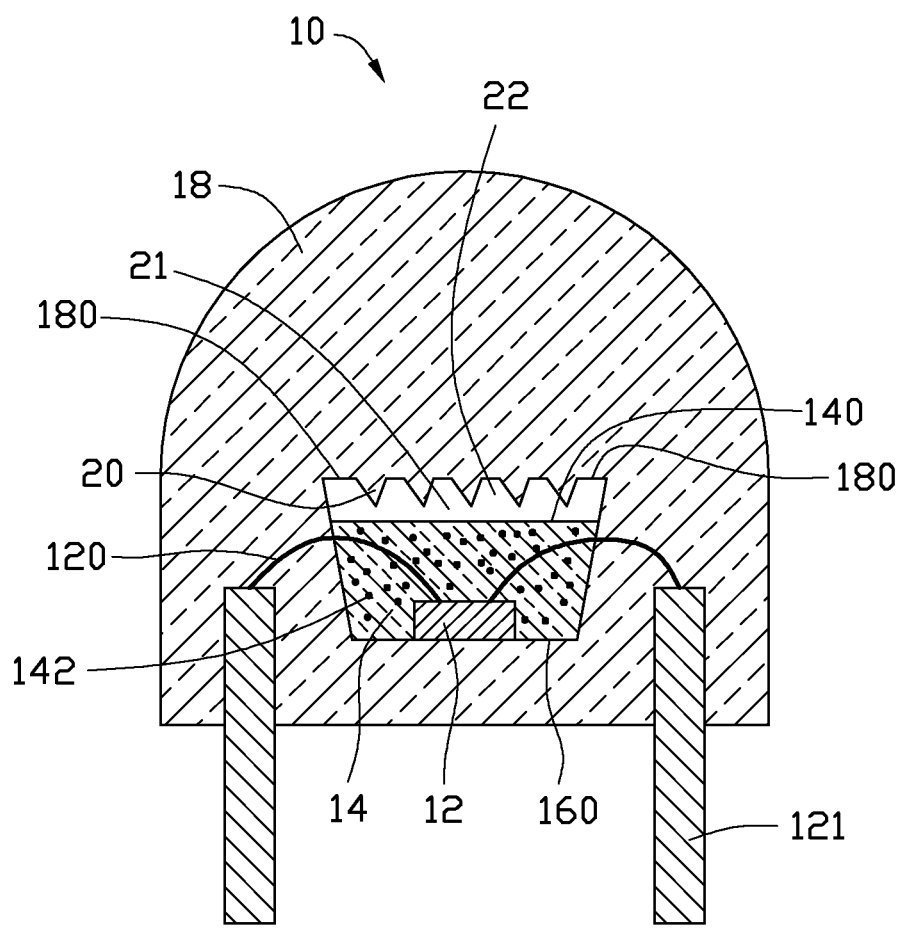
FIG. 3 is similar to FIG. 1, but showing an alternative embodiment of the micro-structure of the LED.
Figure 4:
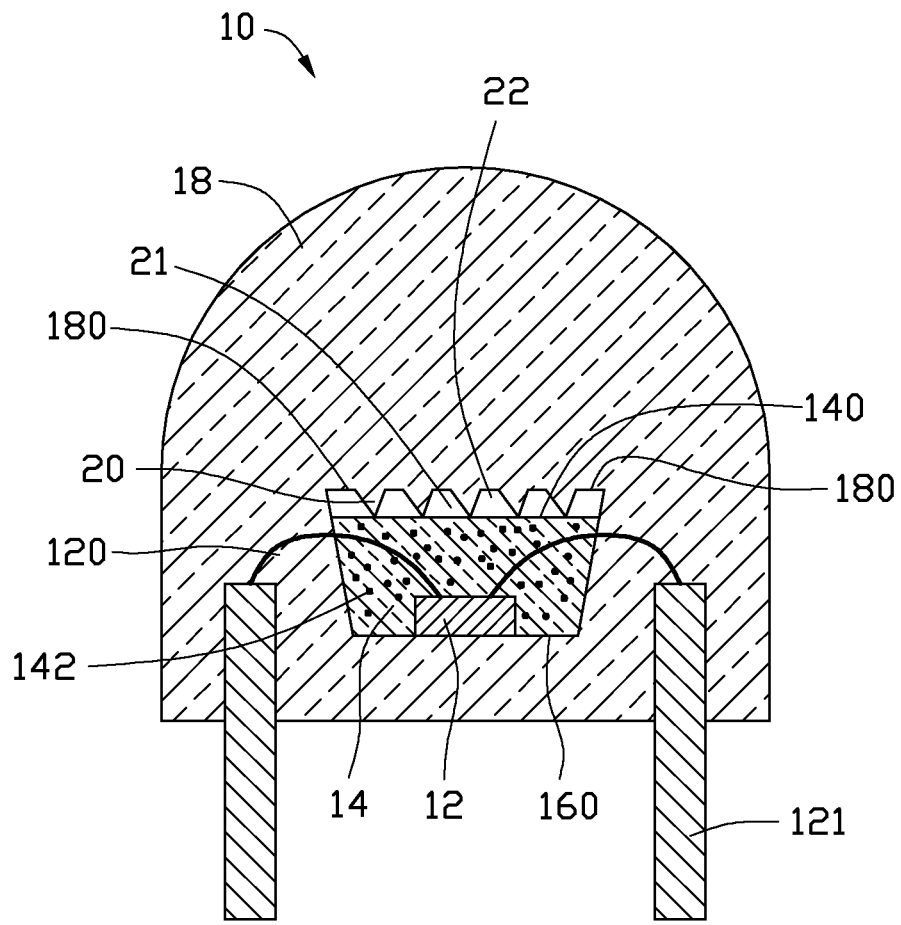
FIG. 4 is similar to FIG. 3, but showing an alternative embodiment of a location of the micro-structure of the alternative embodiment.
Figure 5:
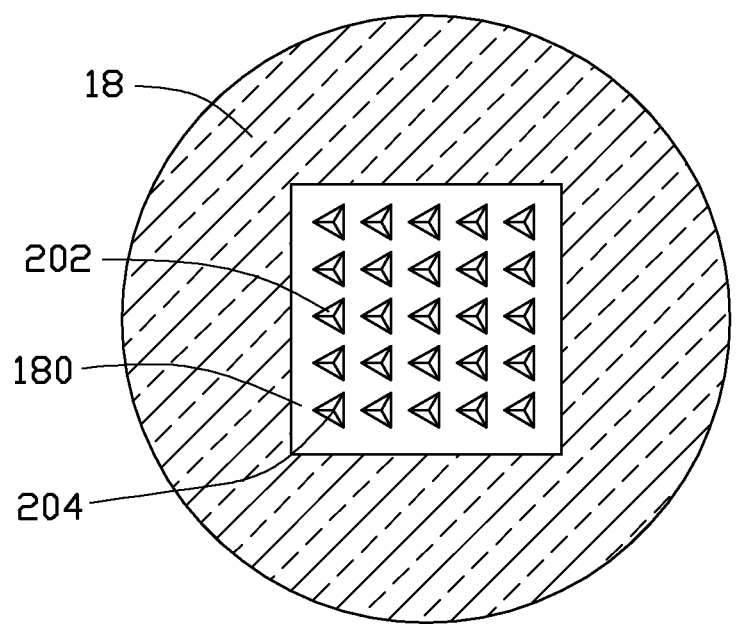
FIG. 5 is similar to FIG. 2, but shows the micro-structure of the alternative embodiment.

The micro-structure 20 includes a number of V-shaped protrusions 200 (see FIG. 2) parallel to each other. The V-shaped portions 200 each have a pointed end (not labeled) in the shape of a line. The V-shaped protrusions 200 are connected to each other without gaps between them, or there is a predetermined distance between each two adjacent V-shaped protrusions 200. Each pointed end is near the first surface 140 but still spaced from the first surface 140, as shown in FIG. 1. Alternatively, each pointed end can be in contact with the first surface 140 (see FIG. 6, described below). The micro-structure 20 may instead consist of a number of cones 202 (see FIGS. 3-5) or other protrusions. The cones 202 are uniformly distributed on the second surface 180. The cones 202 may connect to each other; or may be separated from each other as shown in FIGS. 3-5. The cones 202 each have a peak 204. Each peak 204 is near the first surface 140 (FIG. 3), or is in contact with the first surface 140 (FIG. 4).

The first package 14 may be any one of a number of transparent materials, such as epoxy resin, silicone resin, or glass. The second package 18 may be any one of a number of transparent materials, such as epoxy resin, silicone resin, or glass. The first package 14 includes phosphors 142 configured to change the color of light beams into a different color.

The micro-structure 20 is not in contact with the first surface 140, or only the pointed ends of the micro-structure 20 are in contact with the first surface 140. The light beams of this embodiment first enter an optically thinner medium (the air 22 in the gap 21) from an optically denser medium (the first package 14), and then enter another optically denser medium (the second package 18), so that the radiation angle of the light beams in such other optically denser medium (the second package 18) is larger. Furthermore, the micro-structure 20 allows the light beams to enter the first package 18 at a bigger refraction angle.

Figure 6:
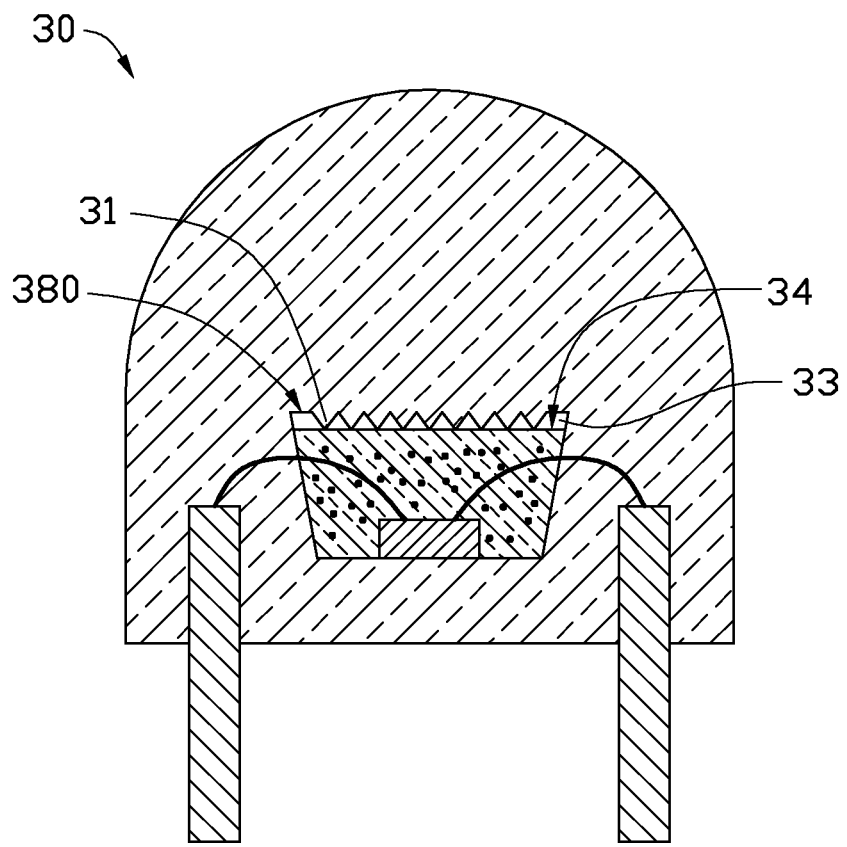
FIG. 6 is a cross-sectional view of an LED in accordance with a second exemplary embodiment.

Referring to FIG. 6, an LED 30 provided by a second embodiment is similar to the LED 10 of the first embodiment. The main difference between the LED 30 and the LED 10 is that a bottom end of the micro-structure 31 contacts the first surface 34. The micro-structure 31 is formed at the second surface 380 and protrudes from the second surface 380 toward the first surface 34. A gap 33 is maintained between the second surface 380 and the first surface 34. The gap 33 also exists between each two adjacent V-shaped protrusions of the micro-structure 31.

Figure 7:
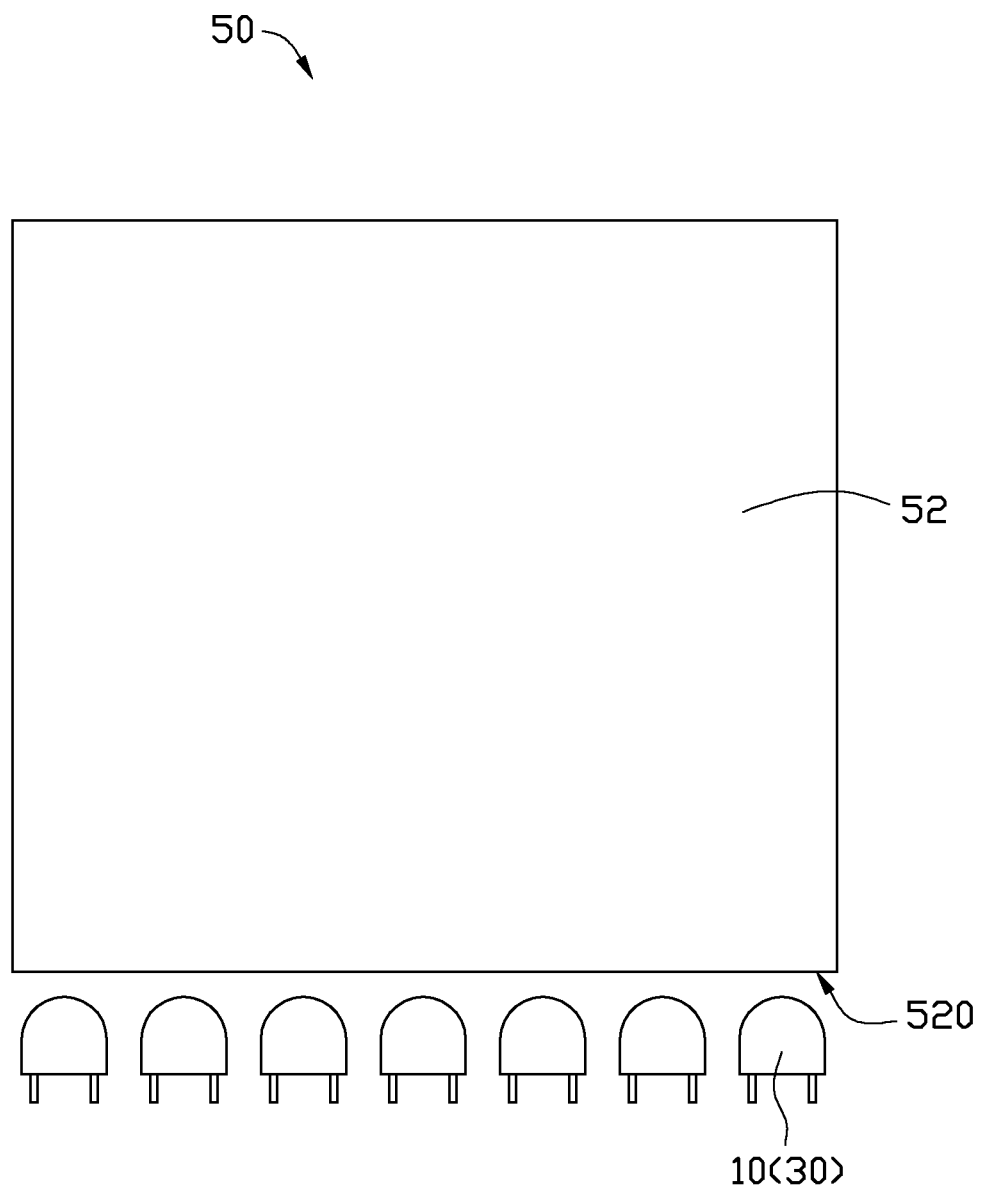
FIG. 7 is a light source incorporating a plurality of LEDs each being formed in accordance with the first embodiment of FIG. 1 or the second embodiment of FIG. 6.

Referring to FIG. 7, a light module 50 in accordance with the present disclosure is shown. The light module 50 includes a light guide plate 52. A light incident surface 520 is defined in one side of the light guide plate 52. A number of the LEDs 10 is arranged adjacent to the light incident surface 520. The LEDs 10 are aligned along a line substantially parallel to the light incident surface 520. The LEDs 10 have larger radiation angles. The light module 50 therefore has a more uniform optical field with smaller or no shadow areas. The light incident surface 520 is a flat surface, and may be distributed with micro-structures to raise the uniformity of the optical field. The LEDs 10 can be replaced by the LEDs 30.

Figure 8:
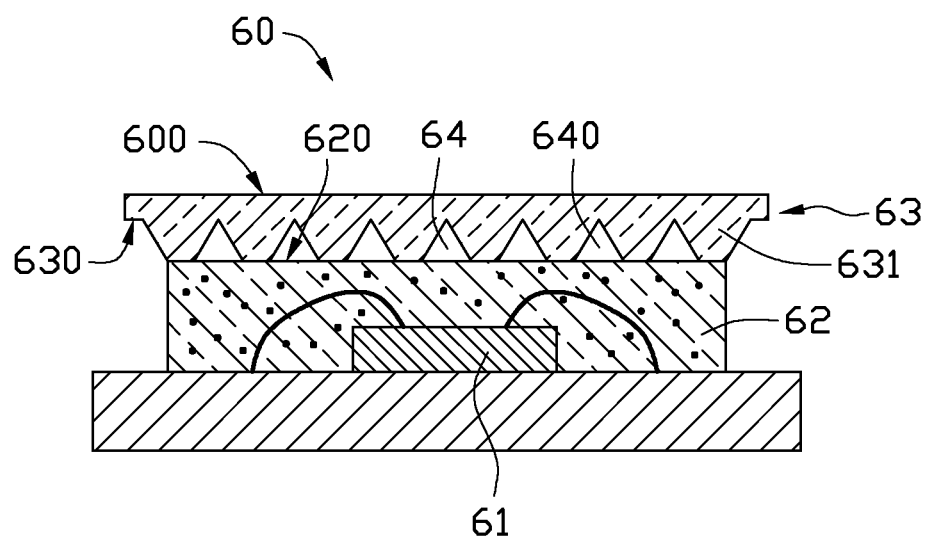
FIG. 8 is a cross-sectional view of an LED in accordance with a third exemplary embodiment.

Referring to FIG. 8, an LED 60 of a third embodiment is provided. The LED 60 is similar to the LED 10 of the first embodiment. The main difference between the LED 60 and the LED 10 is that the outer surface 600 of the LED 60 is a flat surface, whereas the LED 10 has a curved outer surface. The LED 60 is more compact, whereas the LED 10 has a larger radiating range.

The LED 60 includes an LED chip 61, a first package 62, and a second package 63. The first package 62 is configured to package the LED chip 61. The first package 62 has a flat first surface 620. The second package 63 has a planar second surface 630 substantially parallel to the first surface 620. A micro-structure 631 is formed at the second surface 630 and protrudes from the second surface 630 toward the first surface 620. A gap 64 is maintained between the first surface 620 and the second surface 630. A refractive index of a filler 640 filling in the gap 64 is smaller than that of the first package 62 and the second package 63. The filler 640 may be any one of a number of materials such as, air, water, another gas, or another liquid. The filler 640 is air in this embodiment.

The second package 63 is located over the first surface 620, and contacts the first surface 620 with a bottom end of the micro-structure 631 touching the first surface 620. The second package 63 may also completely encapsulate the first package 62. The second package 63 is a flat plate. The second package 63 is made of epoxy resin.

Traditionally, the light beams directly enter the second package 63 from the first package 62; in this embodiment the light beams first enter an optically thinner medium (the air in the gap 64) from an optically denser medium (the first package 62), and then enter another optically denser medium (the second package 63), the radiation angle is larger. Furthermore, the micro-structure 631 allows the light beams to enter the second package 63 at a larger refraction angle.

The LEDs provided by the embodiments may package only one LED chip inside or more than one.

It is understood that the above-described embodiments are intended to illustrate rather than limit the disclosure. Variations may be made to the embodiments without departing from the spirit of the disclosure. Accordingly, it is appropriate that the appended claims be construed broadly and in a manner consistent with the scope of the disclosure.

What is claimed is:

1. A light source, comprising:
    a light guiding plate comprising a light incident surface; and
    a plurality of LEDs arranged adjacent to the light incident surface, each LED comprising:
        an LED chip;
        a first package configured for packaging the LED chip, the first package comprising a flat first surface; and
        a second package configured for packaging the first package, the second package comprising a planar second surface substantially parallel to the first surface, and an outer surface, wherein a micro-structure is formed at the second surface and protrudes from the second surface toward the first surface, a gap is maintained between the first and second surfaces, the gap is filled with a filler, and a refractive index of the filler is smaller than that of the first and second packages; wherein each LED is capable of allowing light generated by the LED chip to penetrate the first surface of the first package, then to enter the filled gap, and then to pass through the micro-structure and the second surface to enter the second package, and finally to exit from the outer surface of the second package.

2. The light source of claim 1, wherein the plurality of LEDs are arranged in a line substantially parallel to the light incident surface.

3. The light source of claim 1, wherein the micro-structure comprises a plurality of V-shaped protrusions parallel to each other, each of the plurality of V-shaped protrusions comprises a straight sharp ridge, and the straight sharp ridge is in contact with the first surface.

4. The light source of claim 1, wherein the micro-structure comprises a plurality of V-shaped protrusions parallel to each other, each of the plurality of V-shaped protrusions comprises a straight sharp ridge and is adjacent to and spaced apart from the first surface.

5. The light source of claim 1, wherein the micro-structure comprises a plurality of cones, each of the plurality of cones comprises a peak, and the peak is in contact with the first surface.

6. The light source of claim 1, wherein the micro-structure comprises a plurality of cones, each of the plurality of cones comprises a peak, and the peak is near and spaced apart from the first surface.

7. The light source of claim 1, wherein the first package is embedded in the second package, the outer surface of the second package is a curved surface, and the second surface is positioned between the first surface and the outer surface.

8. The light source of claim 1, wherein the second package lies on the first package, the outer surface of the second package is a flat surface, and the second surface is positioned between the first surface and the outer surface.

9. The light source of claim 1, wherein the filler is the air.

10. The light source of claim 1, further comprising phosphors scattered in the first package to change the color of the light beams into a different color.

* * * * *